United States Patent
Hussein et al.

(10) Patent No.: US 7,492,560 B2
(45) Date of Patent: Feb. 17, 2009

(54) ASIC LATCH-UP RECOVERY CIRCUIT

(75) Inventors: Hakam D. Hussein, Eagan, MN (US); Wendong Zhang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 285 days.

(21) Appl. No.: 11/010,756

(22) Filed: Dec. 13, 2004

(65) Prior Publication Data

US 2006/0126246 A1 Jun. 15, 2006

(51) Int. Cl.
H02H 3/20 (2006.01)
(52) U.S. Cl. .................................................. 361/91.1
(58) Field of Classification Search ................. 361/91.1
See application file for complete search history.

(56) References Cited

U.S. PATENT DOCUMENTS

| | | | | |
|---|---|---|---|---|
| 4,547,828 A | * | 10/1985 | Bloomer | 361/86 |
| 4,581,673 A | | 4/1986 | Pang | 361/58 |
| 4,761,702 A | | 8/1988 | Pinard | 361/18 |
| 5,212,616 A | | 5/1993 | Dhong et al. | 361/18 |
| 5,454,080 A | * | 9/1995 | Fasig et al. | 710/302 |
| 5,672,918 A | * | 9/1997 | Kimbrough et al. | 307/126 |
| 5,942,932 A | | 8/1999 | Shen | 327/530 |
| 6,064,555 A | * | 5/2000 | Czajkowski et al. | 361/111 |
| 6,473,282 B1 | | 10/2002 | Lin et al. | 361/90 |
| 2004/0228054 A1 | * | 11/2004 | Shiotani | 361/91.1 |

* cited by examiner

*Primary Examiner*—Michael J Sherry
*Assistant Examiner*—Scott Bauer
(74) *Attorney, Agent, or Firm*—Westman, Champlin & Kelly

(57) ABSTRACT

An apparatus and method for controlling a power supply which is coupled to an integrated circuit (IC) that is subject to latch-up is provided. The apparatus includes a comparator circuit that compares a voltage across the IC with a threshold and provides a comparator output. A restart circuit that receives the comparator output, and that receives a fault status signal from the power supply is also included. The restart circuit initiates a restart by shutting off the power supply if the fault status signal is indicative of a latch-up condition in the IC. The restart circuit turns on the power supply if the comparator output indicates that the voltage across the IC is below the threshold.

23 Claims, 5 Drawing Sheets

ASIC LATCH-UP RECOVERY CIRCUIT

FIELD OF THE INVENTION

The present invention relates generally to power supply circuits, and more particularly but not by limitation to a latch-up recovery circuit for use with a power supply circuit that supplies power to an integrated circuit.

BACKGROUND OF THE INVENTION

Integrated circuits (ICs) are known to be used in a wide variety of electronic devices. For example, personal computers, cellular telephones, compact disk players, etc., all include ICs or application specific ICs (ASICs). Also, a disc drive of the type used to interface with a host computer to store and retrieve user data includes ICs that provide a controller for communicating between the host computer and a head-disc assembly of the disc drive.

Complementary Metal Oxide Semiconductor (CMOS) IC devices are prone to "latch-up" due to a parasitic four-layer PNPN path, inherent in most such devices. The parasitic four-layer devices act like a Silicon Control Rectifier (SCR), which once latched cannot be turned off without shutting off the power. Therefore, one technique for recovering from latch-up involves manually turning off or unplugging the power supply to the IC for a short period of time.

A technique for recovering from latch-up without human intervention is described in U.S. Pat. No. 4,761,702 entitled "CMOS LATCH UP RECOVERY CIRCUIT." Here, an overcurrent shut down circuit is included in a power supply that supplies power to an IC. The overcurrent shut down circuit monitors input current to the IC, and in the event the current exceeds a predetermined threshold level, shuts off the power supply for a predetermined length of time after which the supply is automatically reset.

However, the above technique involves indirectly measuring the input current by sensing current induced in a primary winding of a transformer whose secondary winding is coupled to the IC. This indirect measurement of current introduces inaccuracy in the latch-up detection and recovery process. Further, the power supply is turned back on after the predetermined interval of time even if proper recovery from latch-up has not taken place.

Embodiments of the present invention provide solutions to these and other problems, and offer other advantages over the prior art.

SUMMARY OF THE INVENTION

An apparatus and method for controlling a power supply which is coupled to an integrated circuit (IC) that is subject to latch-up is provided. The apparatus includes a comparator circuit that compares a voltage across the IC with a threshold and provides a comparator output. A restart circuit that receives the comparator output, and that receives a fault status signal from the power supply is also included. The restart circuit initiates a restart by shutting off the power supply if the fault status signal is indicative of a latch-up condition in the IC. The restart circuit turns on the power supply if the comparator output indicates that the voltage across the IC is below the threshold.

Other features and benefits that characterize embodiments of the present invention will be apparent upon reading the following detailed description and review of the associated drawings.

DETAILED DESCRIPTION OF ILLUSTRATIVE EMBODIMENTS

The present invention provides a latch-up recovery circuit for use with a power supply that supplies power to an integrated circuit (IC) or application specific IC (ASIC), which is subject to latch-up. When latch-up is detected, the latch-up recovery circuit shuts off the power supply until the voltage across the IC falls below a latch-up recovery threshold. This helps ensure elimination of the latch-up condition in the IC.

Figure 1:
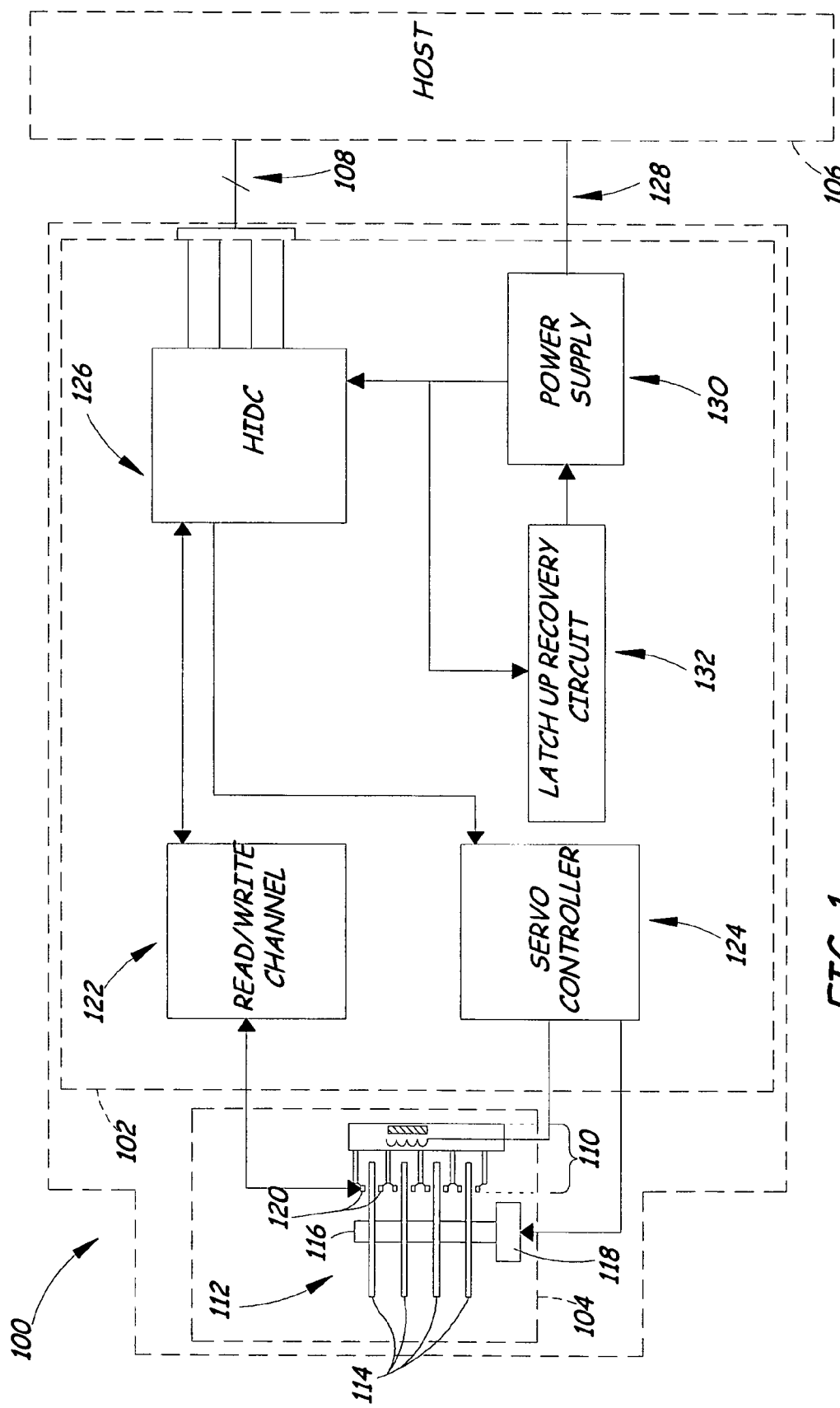
FIG. 1 is a simplified block diagram of a disc drive data storage system including a head-disc assembly and a printed circuit board assembly that includes a latch-up recovery circuit of the present invention.

Referring now to FIG. 1, a disc drive storage system 100 including a head-disc assembly (HDA) 104 and a printed circuit board assembly (PCBA) 102 with which power supply control circuit (or latch-up recovery circuit) 132 of the present invention is useful, is shown. PCBA 102 includes a plurality of ICs (such as read/write channel 122, servo controller 124, and host interface disc controller 126), that provide a target interface controller for communicating between a host system 106 and HDA 104. Host system 106 can include a microprocessor-based data processing system such as a personal computer or other system capable of performing a sequence of logical operations. Data is transmitted between host system 106 and PCBA 102 via a host bus connector 108. Host bus connector 108 may comprise any type of data exchange interface for coupling to a disc controller in a host computer such as SCSI (Small Computer System Interface), UDMA (Ultra Direct Memory Access), ATA (Advance Technology Attachment), or other standards as are known in the industry or are developed in the future. HDA 104 includes an actuator assembly 110 and a disc assembly 112. Disc assembly 112 includes one or more media discs 114, stacked on a spindle assembly 116. Spindle assembly 116 is mechanically coupled to a spindle motor 118 for rotating discs 114 at a high rate of speed.

Actuator assembly 110 includes a voice coil motor, and multiple actuator arms. Located at the end of each actuator arm are one or more transducer heads such as 120, which are associated with a respective disc surface. Transducer heads 120 communicate with read/write channel 122, which performs encoding and decoding of data written to and read from the disc by transducer heads 120.

Servo controller 124 controls the operation of actuator assembly 110 and spindle motor 118. Servo controller 124 maintains a substantially constant spin rate of spindle motor 118.

Host interface disc controller (HDIC) 126 communicates with host system 106 via host bus connector 108 by receiving commands and data from and transmitting status and data back to host system 106. In addition, HDIC 126 tracks the timing of data sectors passing under a currently selected transducer head and accordingly sends data to and receives data from read/write channel 122. Further, HDIC 126 also provides for error detection and error correction on data transmitted to and read from discs 114.

Integrated circuits 122, 124 and 126 receive power from power supply 130, which is coupled to power supply line 128. For simplification, power supply circuit 130 is only shown coupled to IC 126.

ICs such as 122, 124 and 126 are subject to latch-up for reasons provided earlier. As noted above, prior art latch-up recovery circuits have several drawbacks.

For example, one prior art latch-up recovery circuit turns the power supply back on after a predetermined interval of time even if proper recovery from latch-up has not taken place.

Under the present invention, a latch-up recovery circuit (such as 132, which is included in disc drive 100) is provided which, upon detection of latch-up, temporarily shuts off the power supply until the voltage across the IC falls below a latch-up recovery threshold. This helps ensure elimination of the latch-up condition in the IC.

Figure 2:
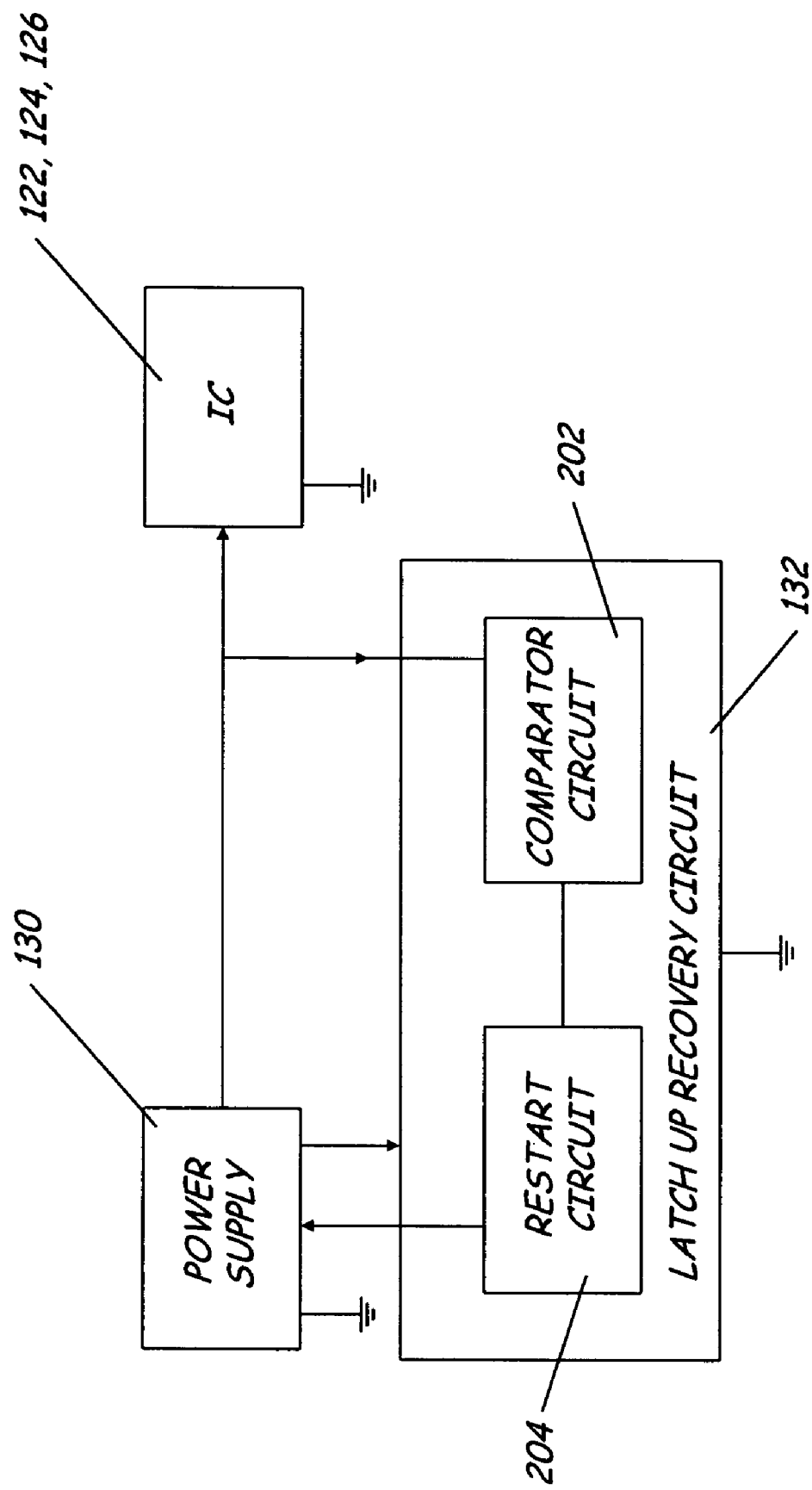
FIG. 2 is a simplified block diagram showing primary components of the latch-up recovery circuit of the present invention.

FIG. 2 is a simplified block diagram showing primary components of latch-up recovery circuit 132. As can be seen in FIG. 2, latch-up recovery circuit 132 includes a comparator circuit 202 and a restart circuit 204. Comparator circuit 202 compares a voltage $V_O$ across the IC with a threshold and provides a comparator output. Restart circuit 204 receives the comparator output, and also receives a fault status signal (shown in FIG. 3) from power supply 130. Restart circuit 204 initiates a restart by shutting off power supply 130 if the fault status signal is indicative of a latch-up condition in the IC. Restart circuit 204 turns on power supply 130 if the comparator output indicates that the voltage across the IC is below the threshold.

Figure 3:
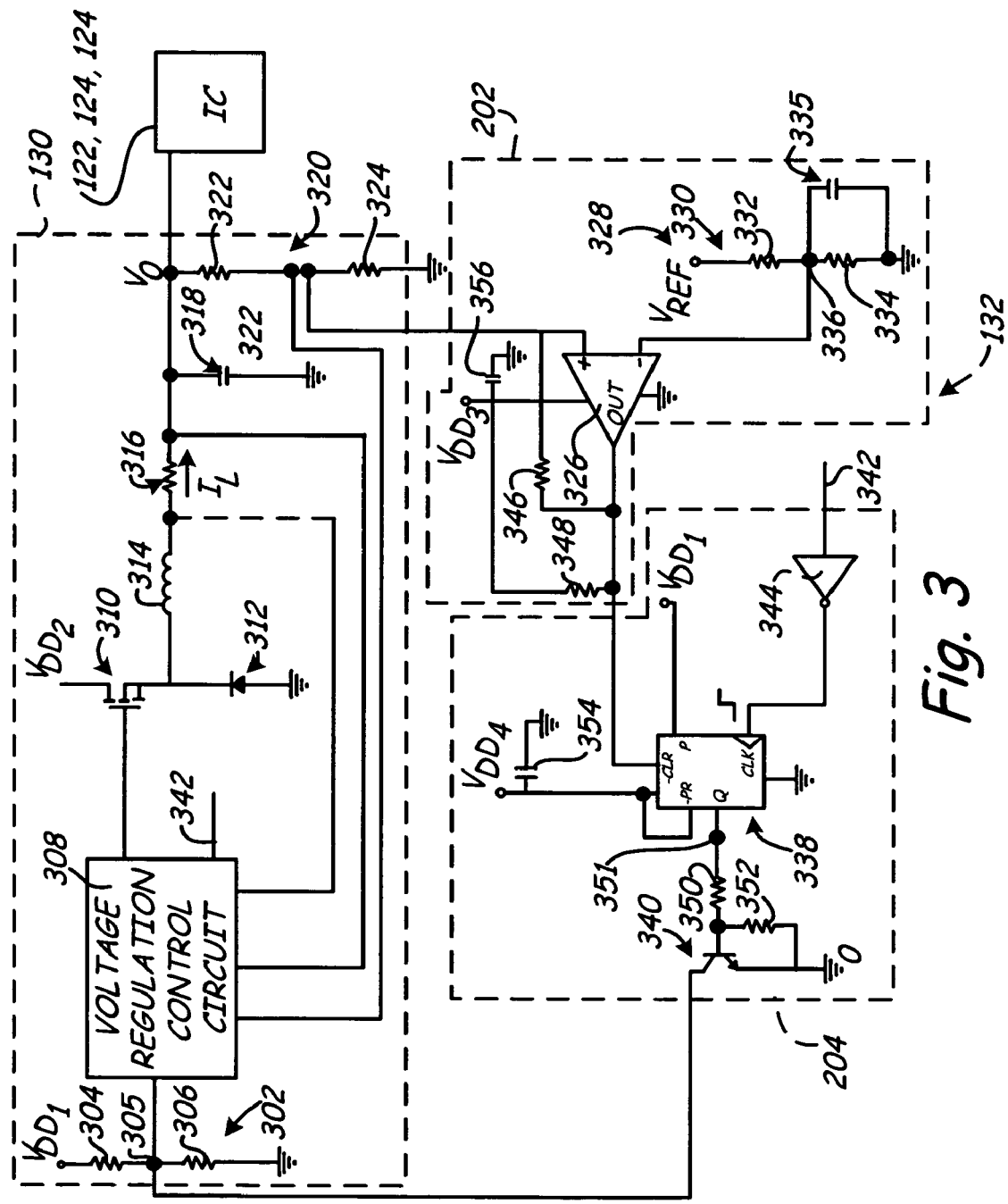
FIG. 3 is a block diagram of another example of a detailed embodiment of a latch up recovery circuit of the present invention.

It should be noted that latch-up recovery circuit 132 is preferably formed as an integrated circuit. Circuit 132 may be produced as a separate silicon chip or integrated with power supply 130 as a single silicon chip. Components of power supply 130 and components of latch-up recovery circuit 132 are described below in connection with FIG. 3. The operation of the latch-up recovery circuit 132 is described further below in connection with FIG. 4, which includes plots that demonstrate how circuit 132 responds to latch-up in the IC. As can be seen in FIG. 3, power supply 130 includes a first voltage divider 302 (which includes resistors 304 and 306), a voltage regulation control circuit 308, a transistor 310 (preferably a MOSFET), a diode 312, an inductor 314 and a resistor 316 connected in series, a capacitor 318 and a second voltage divider 320 (which includes resistors 322 and 324).

As noted earlier in connection with FIG. 2, latch-up recovery circuit 132 includes comparator circuit 202 and restart circuit 204. Comparator circuit 202 includes, as its primary components, a comparator 326 and a reference circuit 328. Reference circuit 328 includes a voltage divider 330 (which includes resistors 332 and 334) and a capacitor 335 connected between node 336 and ground. Reference circuit 328, which connects to an inverting (−) input of comparator 326, provides a latch-up recovery threshold for comparison with the IC voltage which is provided to a non-inverting (+) input of comparator 326.

As can be seen in FIG. 3, restart circuit 204 includes, as its primary components, a latch 338 and a transistor 340. In the circuit shown in FIG. 3, latch 338 has a signal level applied to its D input. The signal level is transferred to its output Q during a positive going transition of a clock (CLK) pulse. Output Q (node 351) of latch 338 is connected to a base of transistor 340. An emitter of transistor 340 is connected to ground and a collector of transistor 340 is connected to node 305 of voltage divider 302.

Figure 4:
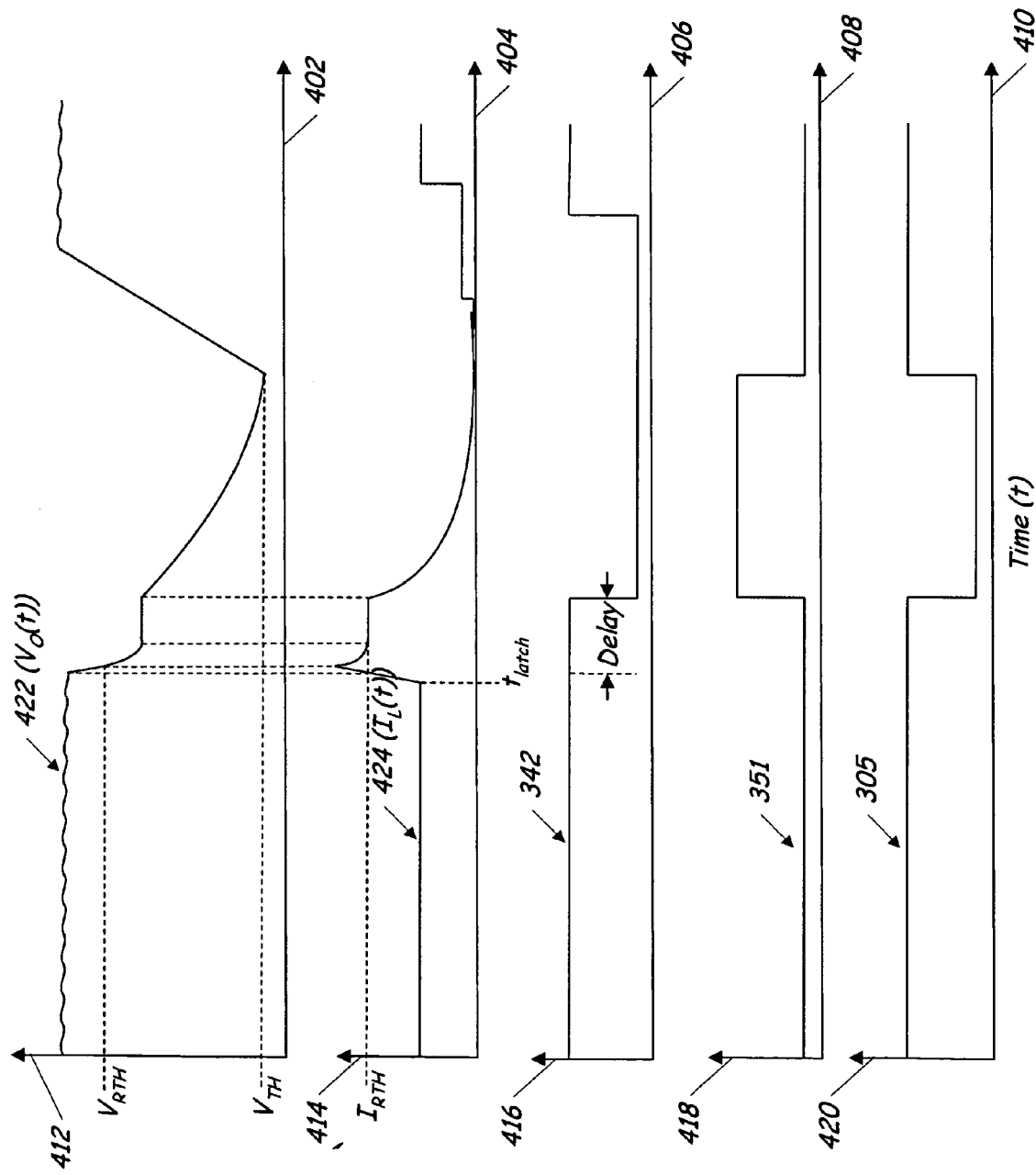
FIG. 4 illustrates plots that demonstrate how the latch up recovery circuit of FIG. 3 responds to latch-up in an integrated circuit.

As mentioned above, power supply 130 includes voltage regulation control circuit 308. For simplification, components of voltage regulation control circuit 308 are not shown. However, in order to carry out voltage regulation, circuit 308 includes current measurement circuitry (which determines/monitors load current $I_L$, received by the IC, by directly measuring the voltage across resistor 316 and computing $I_L$ based on the value of resistor 316 and the measured voltage). Circuit 308 also includes voltage measurement circuit (not shown) that measures/monitors voltage $V_O$ across the IC. A fault status signal 342, used to identify latch-up and other high current drawing fault conditions, is output by circuit 308 and provided as a clock input to latch 338 via inverter 344. Operation of power supply 130 in conjunction with latch-up recovery circuit 132 is described below in connection with the plots shown in FIG. 4. In FIG. 4, the horizontal axes 402, 404, 406, 408 and 410 represent time (t), vertical axes 412, 416, 418 and 420 represent voltage, and vertical axis 416 represents current. Plot 422 represents variation of voltage across the IC with time ($V_O(t)$). Plot 424 represents variation of current drawn by the IC with time ($I_L(t)$). Plot 342 represents the fault status signal. Plot 351 represents output Q of latch 338 and plot 305 represents collector voltage $V_C$ of transistor 340. In FIG. 4, $t_{latch}$ represents the time at which latch-up of the IC occurs. As can be seen in FIG. 4, $V_O(t)$ and $I_L(t)$ have substantially stable values prior to $t_{latch}$. Also, prior to $t_{latch}$, fault status signal 342 is high (indicating no fault condition) flip-flop output Q is low, which keeps transistor 340 off, and collector voltage $V_C$ high. When latch-up of the IC occurs at $t_{latch}$, current $I_L(t)$ starts increasing as shown in plot 424. While current $I_L(t)$ is increasing, there is a corresponding drop in voltage $V_O(t)$ as shown in plot 422. Circuitry within voltage regulation control circuit 308 prevents $I_L(t)$ from rising above a predetermined regulator current threshold $I_{RTH}$, which may be twice the value of the load current during normal operation, for example. However, there is a brief spike in current $I_L(t)$ just after $t_{latch}$. When $V_O(t)$ drops below a predetermined regulator voltage threshold $V_{RTH}$ (set within circuit 308), fault status signal 342 goes low, after a brief delay, to indicate that an over current fault condition has occurred. The inverted fault status signal (which is high) is provided as a clock signal to latch 338. This results in latch output Q going high, which results in transistor 340 turning on, which in turn results in the voltage at node 305 being reduced to ground potential. This shuts off power supply 130. It should be noted that even after power supply 130 is shut off, capacitor 318 is still discharging and therefore the latch-up condition may still be preset in the IC. Thus, as can be seen in FIG. 4, capacitor 318 is allowed to discharge to a voltage level or threshold $V_{TH}$, which is low enough for the latch-up condition to clear. When $V_O(t)$ is less than or equal to $V_{TH}$, the output of comparator 326 changes to reflect the drop in $V_O(t)$. This results in latch 338 being cleared and its output Q going low, which results in transistor 340 being turned off. The results in an increase in potential at node 305, which results in power supply 130 being turned on. As can be seen in FIG. 4, the fault status signal 342 is set to high shortly after power supply 130 is turned back on. It should be noted that supply voltages $V_{DD1}$-$V_{DD5}$ and $V_{REF}$ are received from power supply line 128 (shown in FIG. 1), which is capable of providing multiple supply voltage levels.

It should be noted that, by continuously monitoring $V_O(t)$ and turning on power supply 130 only after $V_O(t)$ is less than or equal to $V_{TH}$, latch-up recovery circuit 132 essentially operates as an adaptive timer that temporarily shuts off power supply 130 for a period of time that depends upon how long it takes for $V_O(t)$ to drop to a level that is less than or equal to $V_{TH}$.

In an example embodiment of the present invention, the components of latch-up recovery circuit 132, which include components not mentioned earlier (resistors 346, 348, 350 and 352, and capacitors 354 and 356), are selected to provide latch-up protection/recovery when $V_{DD1}$ is 12 volts and $V_{DD2}$-$V_{DD5}$ and $V_{REF}$ are each equal to 5 volts. In this embodiment, under normal operating conditions, the voltage supplied to the IC is 1.8 volts and the normal operating current of the IC is 1 ampere.

Figure 5:
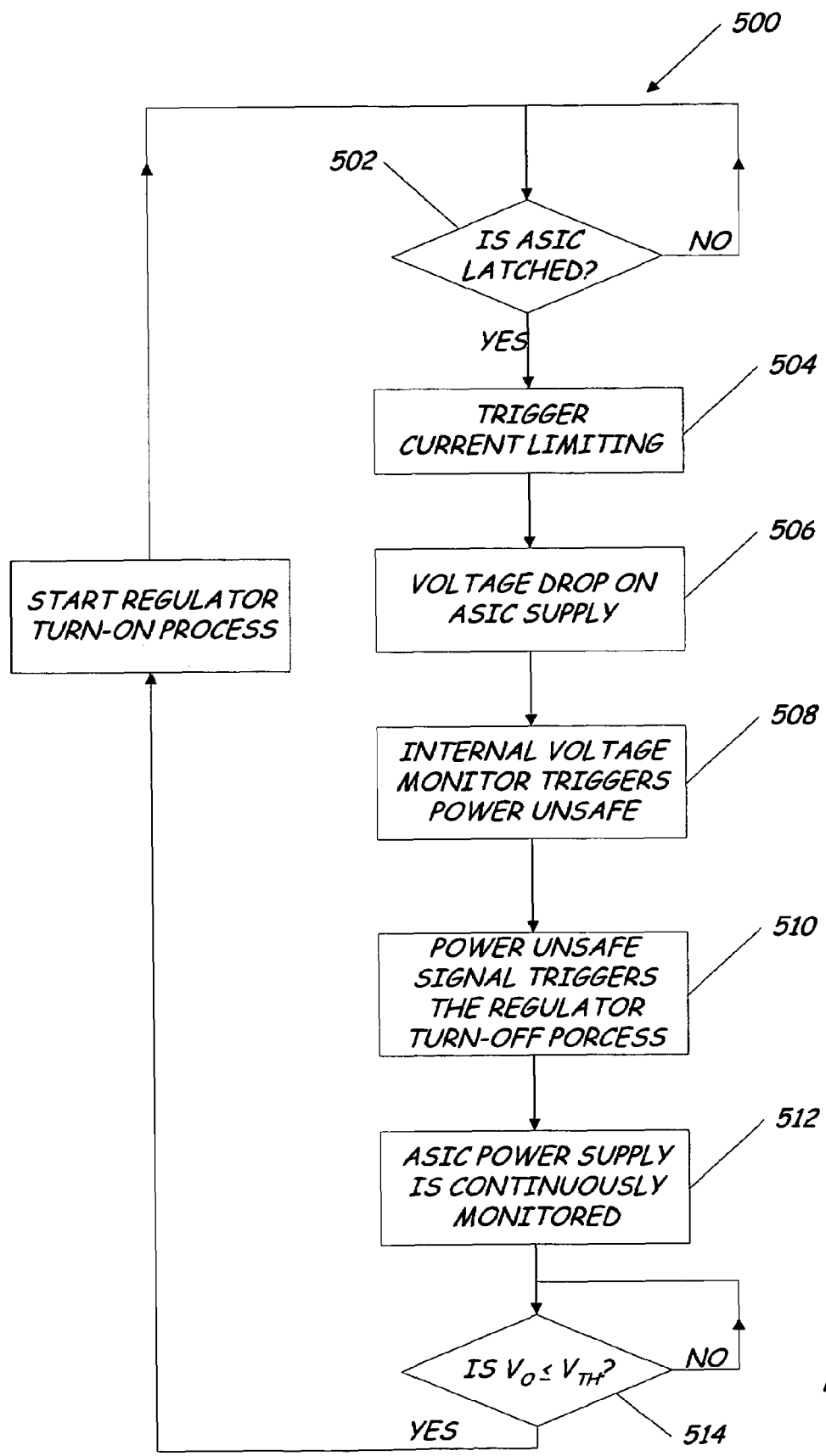
FIG. 5 is a flowchart representing a method of controlling a power supply, which is coupled to an integrated circuit that is subject to latch-up in accordance with an embodiment of the present invention.

Referring now to FIG. 5, a flowchart 500 representing an ASIC latch-up recovery method in accordance with an embodiment of the present invention, is shown. At step 502, a determination is made as to whether or not the ASIC is latched up. If no latch-up is detected, step 502 is repeated. If latch-up is detected in the ASIC, at step 504, a current limiting process is triggered, which limits the current supplied to the ASIC. At step 506, voltage supplied to the ASIC is dropped. At step 508, a voltage monitor, internal to the ASIC power supply, triggers an unsafe power state.

At step 510, a power unsafe signal (or fault status signal) triggers a regulator turn-off process. At step 512, power/voltage ($V_O$) input to the ASIC is continuously monitored. If $V_O$ is less than or equal to $V_{TH}$ at step 514, the regulator is turned on by starting a turn-on process at step 516. It should be noted that step 514 is repeated until $V_O \leq V_{TH}$. Different techniques, some of which are set forth above, can be employed to carry out the steps shown in the flowchart of FIG. 5 while maintaining substantially the same functionality without departing from the scope and spirit of the present invention.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the IC while maintaining substantially the same functionality without departing from the scope and spirit of the present invention. In addition, although the preferred embodiment described herein is directed to a latch-up recovery circuit for a printed circuit board assembly of a disc drive data storage system, it will be appreciated by those skilled in the art that the teachings of the present invention can be applied to any IC that is subject to latch-up, without departing from the scope and spirit of the present invention.

What is claimed is:

1. A circuit for controlling a power supply which is coupleable to an integrated circuit (IC), comprising:
   a comparator circuit configured to compare a voltage across the IC with a first threshold and to provide a comparator output;
   a restart circuit, that receives the comparator output and a fault status signal indicating a latch-up in the IC when the voltage falls below a second threshold that is higher than the first threshold, initiating a restart by:
   shutting off the power supply if the fault status signal indicates the latch-up in the IC; and
   turning on the power supply if the comparator output indicates that the voltage across the IC is below the first threshold.

2. The apparatus of claim 1 wherein the fault status signal is a function of current drawn by the IC.

3. The apparatus of claim 1 wherein the fault status signal is a function of the voltage across the IC.

4. The apparatus of claim 1 wherein the fault status signal is a function of a current flowing through the IC and a voltage across the IC.

5. The apparatus of claim 1 wherein the restart circuit comprises a transistor which is turned on to shut off the power supply and turned off to turn on the power supply.

6. The apparatus of claim 5 wherein the restart circuit further comprises a latch having an output that controls the turning on and turning off of the transistor.

7. The apparatus of claim 6 wherein the fault status signal serves as a clock signal for the latch.

8. The apparatus of claim 1 wherein the comparator circuit comprises a comparator and a reference circuit that provides the threshold.

9. The apparatus of claim 8 wherein the reference circuit comprises a voltage divider.

10. A disc drive employing the apparatus of claim 1.

11. A method of controlling a power supply which is coupleable to an IC, comprising:
    providing a comparator output, which is based on a comparison of a voltage across the IC with a first threshold;
    receiving a fault status signal that indicates a latch-up in the IC when the voltage falls below a second threshold that is higher than the first threshold;
    shutting off the power supply if the fault status signal indicates the latch-up in the IC; and
    turning on the power supply if the comparator output indicates that the voltage across the IC is below the first threshold.

12. The method of claim 11 wherein the fault status signal is a function of current drawn by the IC.

13. The method of claim 11 wherein the fault status signal is a function of the voltage across the IC.

14. The method of claim 11 wherein the fault status signal is a function of a current flowing through the IC and a voltage across the IC.

15. The method of claim 11 wherein the shutting off of the power supply is carried out by turning on a transistor and the turning on of the power supply is carried out by turning off the transistor.

16. The method of claim 15 wherein the turning on and turning off of the transistor is controlled by an output of a latch.

17. The method of claim 16 wherein the fault status signal serves as a clock signal for the latch.

18. The method of claim 11 wherein the comparator output is provided by a comparator circuit that comprises a comparator and a reference circuit, which provides the threshold.

19. The method of claim 18 wherein the reference circuit comprises a voltage divider.

20. A controlled power supply for an IC comprising:
    a power supply circuit; and
    an adaptive timing means for removing a latch-up in the IC by, upon detection of the latch-up, temporarily shutting down the power supply circuit for a period of time taken for a voltage across the IC to drop to a level that is less than or equal to a predetermined first voltage threshold, wherein the latch-up is detected in the IC when the voltage falls below a second voltage threshold, which is higher than the first voltage threshold.

21. An integrated power supply and latch-up recovery circuit for providing power to an IC, comprising:

a voltage regulation control circuit that directly measures a current flowing through the IC and produces a fault status signal as a function of the measured current flowing through the IC;

a restart circuit that receives the fault status signal, which indicates a latch-up in the IC when the voltage falls below a second threshold that is higher than the first threshold, and shuts off the power supply if the fault status signal indicates the latch-up in the IC; and a comparator circuit configured to compare a voltage across the IC with a first threshold and to provide a comparator output, wherein the restart circuit receives the comparator output and turns on the power supply if the comparator output indicates that the voltage across the IC is below the first threshold.

22. The apparatus of claim 21 wherein the restart circuit comprises a transistor which is turned on to shut off the power supply and turned off to turn on the power supply.

23. The apparatus of claim 22 wherein the restart circuit further comprises a latch having an output that controls the turning on and turning off of the transistor.

* * * * *